United States Patent [19]

Makino et al.

[11] 4,212,688

[45] Jul. 15, 1980

[54] ALLOY FOR MAGNETORESISTIVE ELEMENT AND METHOD OF MANUFACTURING THE SAME

[75] Inventors: Yoshimi Makino; Tsutomu Okamoto, both of Yokohama, Japan

[73] Assignee: Sony Corporation, Tokyo, Japan

[21] Appl. No.: 956,672

[22] Filed: Nov. 1, 1978

[30] Foreign Application Priority Data

Feb. 27, 1978 [JP] Japan .................................. 53-22626

[51] Int. Cl.$^2$ ............................................ C22C 19/00
[52] U.S. Cl. .................................. 148/31.55; 75/170; 148/31.57; 148/32
[58] Field of Search .................... 75/170, 135; 148/32, 148/32.5, 31.55, 31.57

[56] References Cited

U.S. PATENT DOCUMENTS 4,093,453  6/1978  Makino et al. ......................... 75/135

Primary Examiner—R. Dean
Attorney, Agent, or Firm—Hill, Van Santen, Steadman, Chiara & Simpson

[57] ABSTRACT

An alloy for a magnetoresistive element has an ordered phase with superstructure and consists of nickel and cobalt atoms, and the ratio of the nickel atoms to the cobalt atoms by the number of atoms is substantially within the range of 40:60 to 60:40.

A method of manufacturing an alloy for a magnetoresistive element includes the steps of preparing a substrate for a magnetoresistive element, and forming so a nickel-cobalt alloy film on the substrate at the temperature of more than 250° C. that the alloy has an ordered phase with superstructure and the ratio of the nickel atoms to the cobalt atoms by the number of atoms is within the range of 40:60 to 60:40.

15 Claims, 14 Drawing Figures

SUBSTRATE TEMPERATURE Ts 300°C

FIG.1 PRIOR ART

SUBSTRATE TEMPERATURE Ts 150°C

FIG.2

SUBSTRATE TEMPERATURE Ts 300°C

ALLOY FOR MAGNETORESISTIVE ELEMENT AND METHOD OF MANUFACTURING THE SAME

BACKGROUND OF THE INVENTION

1. Field of the Invention

This invention relates to an alloy suitable applicable to a magnetoresistive element, and a method of manufacturing the same.

2. Description of the Prior Art

Generally, a magneto-electric transducer is widely used as a contact-less switch, a switching element for a brushless electric motor or the like. Examples of the magneto-electric transducer are a semi-conductor Hall element, a semi-conductor magnetoresistive element, a planar Hall element and a ferromagnetic magnetoresistive element.

However, in the semiconductor element, the number of the carriers and the mobility are greatly influenced by temperature, and so the temperature characteristics are bad. Accordingly, the semiconductor element requires an external circuit for temperature compensation. The output voltage of the planar Hall element is low. Accordingly, for example, when it is used for driving the brushless electric motor, it requires a special peripheral circuit such as a high gain amplifier. Further, the unbalance voltage of the magnetoresistive element is high in comparison with the output voltage thereof, since the magnetoresistive element is a two-terminal element. Particularly, the change of the unbalance voltage due to the change of the resistivity with temperature cannot be neglected in comparison with the output voltage. Accordingly, the zero-point drift due to change of temperature comes into question for practical use.

The same assignee already filed the Japanese Patent Application (No. 79655/1973) corresponding to the U.S. Pat. No. 3,928,836 for a magneto-electric transducing element to overcome the above-described defects of the conventional magneto-electric transducing elements. The magneto-electric element includes two strips made of ferromagnetic material having magnetoresistive effect which are electrically connected to each other in series. The current paths of the two strips are perpendicular to each other. An output terminal is connected to the junction between the strips. Current supply terminals are connected to the opposite ends of the strips. In the corresponding U.S. Pat. No. 3,928,836, the above magneto-electric transducing element is stated as "a magnetoresistive element comprising an insulating substrate, a first current conducing ferromagnetic metal film strip on said substrate and having a current carrying ability predominantly in one direction, a second current carrying ferromagnetic metal film strip on said substrate having a current carrying ability predominantly in a direction substantially perpendicular to said one direction, first ends of said strips being connected together, a current input terminal connected to the opposite ends of said strips and an output terminal connected to the junction between the two strips."

When a magnetic field intensive enough to saturate the ferromagnetic strips is applied to the current path of the one strip at an angle $\theta$, the output voltage changes in proportion to $(\Delta\rho/\rho o) \cos 2\theta$, where $\Delta\rho = \rho_\| - \rho_\perp$, $2\rho_o = \rho_\| + \rho_\perp$, $\rho_\perp$ represents the resistance when the saturable magnetization and the current are perpendicular to each other, and $\rho_\|$ represents the resistance when they are in parallel with each other. The change of the output voltage is maximum and minimum at the angle $\theta = 0°$ and $90°$, respectively, where the switching operation is effected. The above described defects of the conventional magneto-electric transducing elements have been removed by the above magneto-resistive element.

However, some problems to be further solved have been found out on the above described magneto-resistive element.

Generally, in the manufacture of the magneto-resistive element, an Si (silicon) substrate is used from the view points of mass-production and cost-down. Since the Si substrate is thin, its strain resistivity is low. Accordingly, the saturation characteristic of the output of the magnetoresistive element is deteriorated. The characteristics of the magneto-resistive elements are much dispersed. The deterioration of the strain resistivity results in the central point potential deviation (the potential deflection of the junction between the two ferromagnetic strips) due to piezo-resistance effect. Accordingly, an expensive alumina substrate should be used for a contactless switch requiring high accuracy. Moreover, for the magnetoresistive element, it is preferable to select an alloy system whose magnetoresistive anisotropy ratio ($\Delta\rho/\rho o$) is large. The conventional alloy for such purpose is 76 Ni-24 Co alloy. However, its magnetostriction constant is large, and its strain resistivity is not improved.

SUMMARY OF THE INVENTION

An object of this invention is to provide a alloy for a magnetoresistive element and a method of manufacturing the same by which the above described problems can be solved.

Another object of this invention is to provide an alloy for a magnetoresistive element whose magnetostriction constant is small and moreover whose magnetoresistance anisotropy ratio is large, and to provide a method of manufacturing such an alloy.

In accordance with an aspect of this invention, an alloy for a magnetoresistive element has an ordered phase with superstructure (superlattice) and consists of nickel and cobalt atoms, and the ratio of the nickel atoms to the cobalt atoms by the number of atoms being substantially within the range of 40:60 to 60:40.

In accordance with another aspect of this invention, a method of manufacturing an alooy for a magnetoresistive element includes the steps of preparing a substrate for a magnetoresistive element, and forming so a nickel-cobalt alloy film on the substrate at the temperature of more than 250° C. that the alloy has an ordered phase with superstructure and the ratio of the nickel atoms to the cobalt atoms by the number of atoms is within the range of 40:60 to 60:40.

Generally, it is known that an Ni-Co alloy has a relatively large magneto-resistance anisotropy ratio $\Delta\rho/\rho o$ in comparison with other ferromagnetic alloys. The Ni-Co alloy has crystallographically face-centered-cubic structure on whose lattice points Ni atoms and Co atoms are arranged.

In an Ni-Co alloy bulk which can be generally obtained by melting and cooling, or an Ni-Co alloy film which can be formed on a substrate at a lower temperature, nickel atoms and cobalt atoms are irregularly arranged on the lattice points of the face-centered-cubic structure. There is no report on the confirmation of high regularity of the atom arrangement of the Ni-Co alloy. For a conventional magnetoresistive element, such as Ni-Co alloy has been used that the ratio of nickel atoms to cobalt atoms is about 76/24 (76Ni--24Co) only in consideration of magnetoresistance effect. However, the magnetostriction constant of the Ni-Co alloy having such a composition is large, resulting in various disadvantages.

On the other hand, an Ni-Co alloy having the composition of 40Ni-60Co to 60Ni-40Co according to this invention has a small magnetostriction constant and moreover, a large magnetoresistance anisotropy ratio due to formation of the ordered phase with superstructure. Accordingly, these inventors have found that the above described problems can be completely solved by the Ni-Co alloy having the ordered phase with superstructure of the composition of 40Ni-60Co to 60Ni--40Co.

Various other objects, advantages and features of the present invention will become readily apparent from the ensuring detailed description, and the novel features will be particularly pointed out in the appended claims.

DESCRIPTION OF THE PREFERRED EMBODIMENTS

The principle and construction of this invention will be described in detail with reference to the accompanying drwaings.

An alloy of this invention is one for a magnetoresistive element, the alloy having an ordered phase with superstructure and consisting of nickel and cobalt atoms, the ratio of nickel atoms to cobalt atoms by the number of atoms being substantially within the range of 40:60 to 60:40. This invention provides also a method of manufacturing an alloy for a magnetoresistive element comprising the steps of preparing a substrate for a magnetoresistive element, and forming a nickel-cobalt alloy film on the substrate at the temperature of more than 250° C. so that the alloy has an ordered phase with superstructure and the ratio of the nickel atoms of 40:60 to 60:40.

The reason why the ratio of the nickel atoms to the cobalt atoms in the alloy (Ni-Co alloy) according to this invention are limited to the above-described range will be first explained. That is, an Ni-Co alloy containing Ni less than 40Ni-60Co has a lower magnetoresistance anisotropy $\Delta\rho/\rho o$ and therefore it is difficult to be used as a magneto-resistive element. And, an NI-Co alloy containing Ni more than 60Ni-40Co has a larger magnetostriction constant and a poor strain resistivity, and so the deviation of the central point potential of such element is larger only to weaken the effect of this invention.

The film thicknesses of Ni-Co alloy film according to this inention which is formed by, for example, vacuum evaporation on the substrate has preferably a thickness of less than 10,000 Å. This reason is that when the film thickness is above 10,000 Å, the impedance of the element is too low to increase the drive power. A practical range of the film thicknesses is 1,000~3,000 Å.

It is practical that the substrate temperature at the formation of the Ni-Co alloy by, for example, vacuum evaporation according to this invention is in the range of 250° to 500° C., preferably 300° to 500° C. This reason is that when the substrate temperature is below 250° C., the alloy has not the superstructure phase and the magnetoresistance effect thereof is lower, and that when the substrate temperature is too high, there is a fear that the substrate is melted or destroyed and further the working property for manufacturing the element is deteriorated due to more time required to raise or lower the temperature.

The vacuum evaporation process according to this invention is practically effected at the speed of 20 to 100 Å/sec, preferably of 40 to 80 Å/sec. That is, when the speed is below 20 Å/sec, the magnetic saturation property of the element is poorer, and when the speed is above 100 Å/sec, it is difficult to provide uniform alloy films and the properties of the elements tend to more vary.

Figure 1:
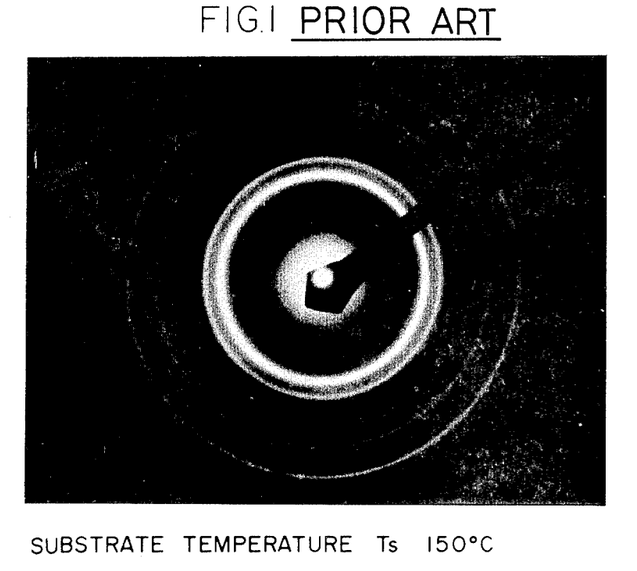
FIG. 1 is a photograph of electron beam diffraction of a 50Ni-50Co alloy evaporated on a substrate at the temperature of 150° C.
Figure 2:
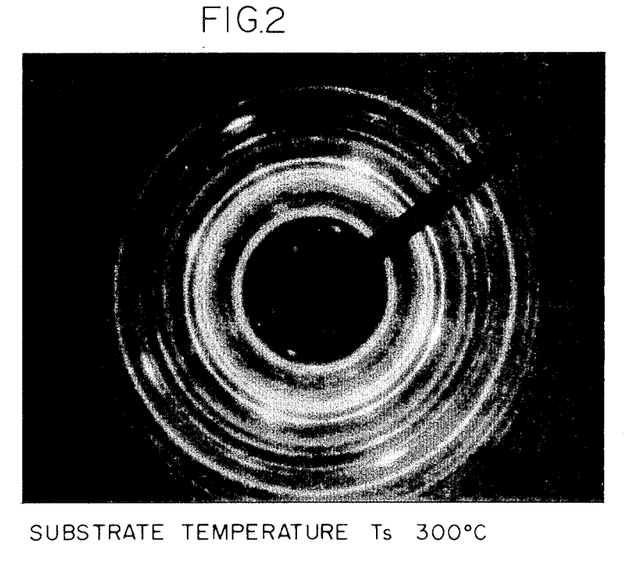
FIG. 2 is a photograph of electron beam diffraction on a 50Ni-50Co alloy evaporated on a substrate at the temperature of 300° C.

FIG. 1 and 2 are photographs of electron beam diffraction for explaining this invention. FIG. 1 shows a comparative example regarding a 50Ni-50Co alloy deposited by the vacuum evaporation at a substrate temperature of 150° C. FIG. 2 shows an embodiment of this invention regarding a 50Ni-50Co alloy deposited by the vacuum evaporation at a substrate temperature of 300° C. FIG. 1 shows a diffraction pattern of the Ni-Co alloy having a typical face centered cubic (FCC) lattice wherein the most inner diffraction ring corresponds to (111) plane, the next one corresponds to (200) plane and so on. This fact shows that the arrangement of the Ni and Co atoms in the alloy of FIG. 1 is in disorder, which will be clarified also by the below description. On the other hand, it can be clearly observed from FIG. 2 that many new diffraction rings and spots as well as the FCC pattern of FIG. 1 appear. The diffraction pattern of FIG. 2 accordingly shows that the structure of the 50Ni-50Co alloy according to this invention is based on FCC and further comprises a lattice having more diffraction planes than FCC.

Figure 3A:
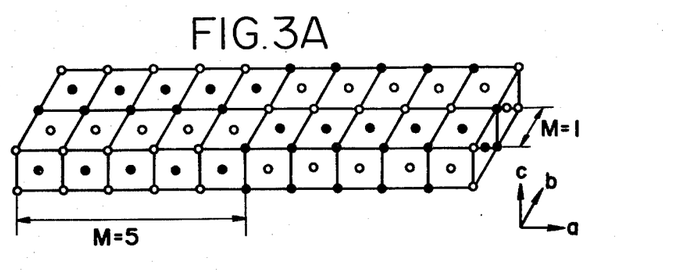
FIG. 3A is a schematic perspective view of the crystal structure of the alloy of FIG. 2.
Figure 3B:
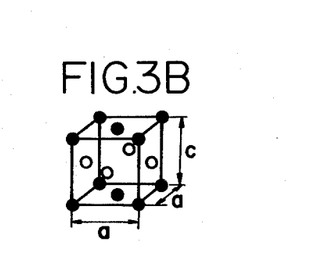
FIG. 3B is a schematic perspective view of the crystal structure of the CuAu I type.
Figure 3C:
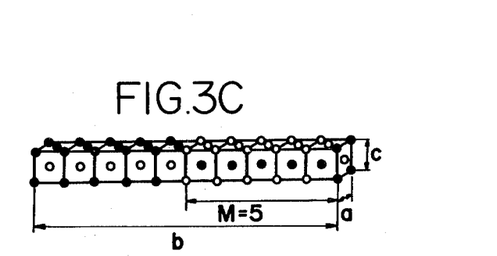
FIG. 3C is a schematic perspective view of the crystal structure of the CuAu II type.

According to a result of a detailed analysis of the diffraction pattern of FIG. 2, it is found out that the 50Ni-50Co alloy according to this invention has the superstructure as shown in FIG. 3A. In FIG. 3, black and white circles show Co and Ni atoms respectively, a, b and c indicate the principal lattice axes and M is the length of antiphase domain measured in the unit of the lattice constant of primitive cell. The structure of FIG. 3A is based on the well-known superstructures as CuAu I type (FIG. 3B) or CuAu II type (FIG. 3C). That is, the arrangement of Ni and Co atoms in the conventional Ni-Co alloy is under the entirely disordered state, however, the Ni-Co alloy according to this invention has the ordered phase comprising the superstructure based on the CuAu I or CuAu II type. Because of the presence of such superstructure, the element according to this invention has a remakably improved magnetoresistance effect in comparison with the conventional elements.

Figure 4:
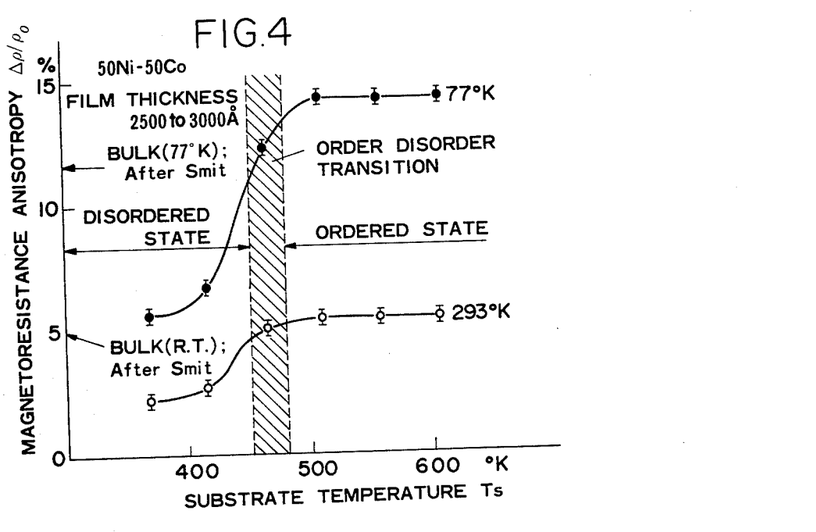
FIG. 4 is a graph showing the relationship between the substrate temperature on evaporation and the magnetoresistance anisotropy of an alloy.

FIG. 4 is a graph showing a relationship between the substrate temperature Ts and the magnetoresistance anisotropy $\Delta\rho/\rho o$. There were used sampels which had an alloy film of 50Ni-50Co deposited by vacuum evaporation at the thicknesses of 2500 to 3000 Å. In this case, the measuring temperature were a room temperature (293° K) and 77° K, and a magnetic field of 2 KOe was used. A shaded area in FIG. 4 illustrates a transition region between the ordered state having the superstructure and the disordered state of the arrangement of the Ni and Co atoms. The arrangement of the Ni and Co atoms is under the disordered state in an area of a lower substrate temperature than that of the transition area and under the ordered state in an area of a higher substrate temperature than that of the transition area. Particularly, it is under the highly ordered state at a substrate temperature above 523° K. (250° C.). FIG. 4 shows the fact that the magnetoresistance anisotropy ratio $\Delta\rho/\rho o$ is relatively low in the disordered state and increases sharply as the substrate temperature rises therefrom or aound the transition temperature, and that the ratio $\Delta\rho/\rho o$ becomes constant or saturated at the highest value in the order state. As shown in FIG. 4, the saturation value of the ratio is in excess of the measured value in the alloy bulk which is reported by L. Smit, Physica XVI N.6, 612 (1951). Accordingly, it will be understood that the Ni-Co alloy having the superstructure in the ordered state accordng to this invention has the remarkably higher magnetoresistance anisotropy $\Delta\rho/\rho o$ than the conventional Ni-Co alloy in the disordered state. By the way, as shown in FIG. 5, in comparison with FIG. 4, the peak point or the saturation point of the magnetoresistance anisotropy ratio of the Ni-Co alloy according to this invention tends in general to shift to the right direction in the drawing as the thickness of the Ni-Co alloy film is lesser than that described above.

Figure 6:
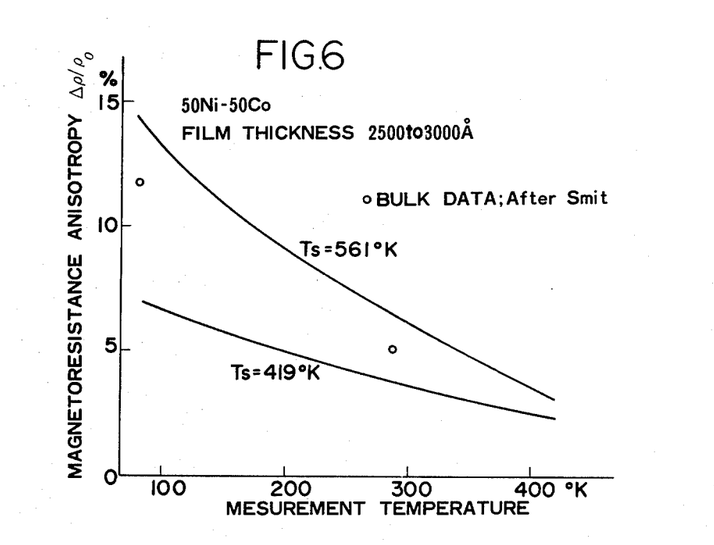
FIG. 6 is a graph showing the relationship between the measurement temperature and the magnetoresistance anisotropy.

FIG. 6 shows the temperature dependence of the magnetoresistance anisotropy $\Delta\rho/\rho o$ on similar samples to those in FIG. 4, in the ordered state (the substrate temperature Ts at the vacuum evaporation: 561° K.) and the disordered state (the substrate temperature Ts at the vacuum evaporation: 419° K.). Also from these data, it is found that the magnetoresistance anisotropy of the ordered state according to this invention is kept high over the whole temperature range for use, particularly at the lower temperature.

Figure 5:
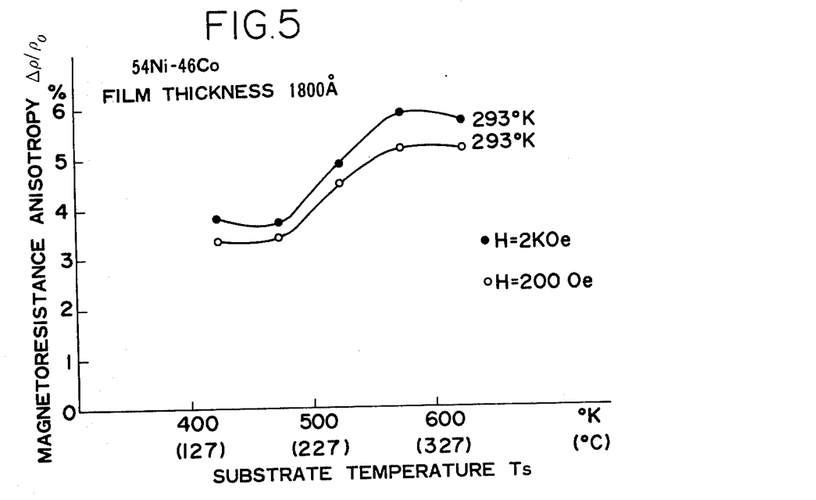
FIG. 5 is a graph showing the relationship between the substrate temperature on evaporation and the magnetoresistance anisotropy of another alloy.
Figure 7:
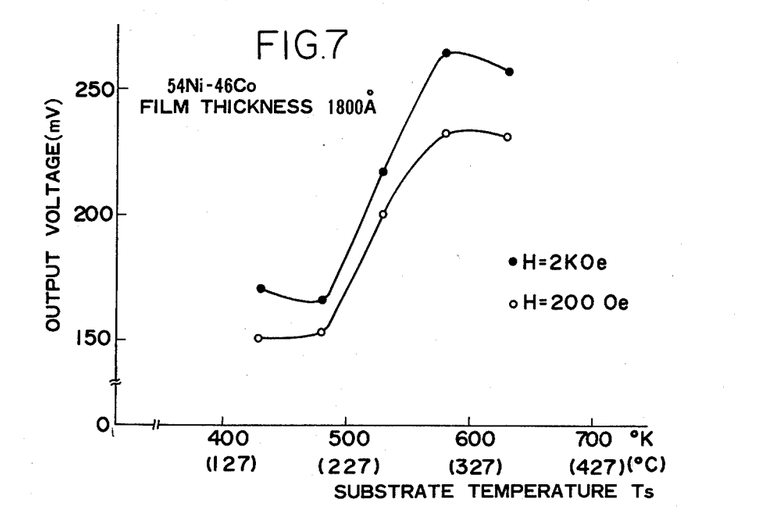
FIG. 7 is a graph showing the relationship between the substrate temperature on evaporation and the output voltage.

FIG. 7 is a graph showing a relationship between the substrate temperature Ts at the vacuum evaporation and the output voltage of the magnetoresistive element having the alloy film of 54Ni-46Co (corresponding to FIG. 5). The sampeles for use are made in such way that after the RF melting of Ni and Co at a desired ratio in the atmosphere of Ar gas of 1 atm the melted mixture was casted in an iron mold and thus casted alloy plate was formed into a ribbon-like shape by cold rolling to be used for the vacuum evaporation. The substrate for the vacuum evaporation was a plane glass plate of 1 mm thickness. The resistance heating method by the use of electric resistance of tungsten (wolfram) was used for vacuum evaporation coating and the degree of vacuum was $2 \times 10^{-5}$ mmHg. The substrate temperatures at the evaporation were 150°, 200°, 250°, 300° and 350° C. respectively. The alloy film thickness was about 1800 Å. The measurements were effected under the drive voltage of DC 10 V and the magnetic fields of 200 Oe and 2 KOe. As clearly in FIG. 7, the output voltage increases sharply around the substrate temperature of 250° C., that is, arround the transistion temperature between the ordered state having the superstructure and the disordered state. Though the substrate temperature to cause the above-mentioned transistion in FIG. 7 shifts somewhat to the right direction in the drawing because of the difference of the film thickness in comparison with that shown in FIG. 4, FIG. 7 shows a similar manner to FIG. 4 as a whole. That is easily supposed because the change of the output voltage is in proportion to the magnetoresistance anisotropy $\Delta\rho/\rho o$.

The output voltages of element in which an Si substrate was used are shown in the following table. The measurements were effected under the drive voltage of DC 10 V and the magnetic field of 200 Oe. An element having an alloy film of 76Ni-24Co deposited by the vacuum evaporation coating at the substrate temperature of 250° C. was employed as a comparative example. An element having an alloy film of 54Ni-46Co deposited by the vacuum evaporation coating at the substrate temperature of 300° C. was used as an embodiment of this invention.

|  | Composition | Substrate Temperature | Output Voltage (mv) |
| --- | --- | --- | --- |
| Comparative Example | 76Ni-24Co | 250° C. | 240 |
| Embodiment | 54Ni-46Co | 300° C. | 230 |

As apparent from this table, the drop of the output voltage of the 54Ni-46Co alloy according to this invention is lesser than the conventional 76Ni-24Co alloy having the highest magnetoresistance anisotropy $\Delta\rho/\rho o$. The drop of the output voltage of the alloy of this invention causes substantially no problem in practice. This will be easily understood from the fact that the magnetoresistance anisotropy $\Delta\rho/\rho o$ and the output voltage of the element are remarkably improved by such construction of the element as this invention, as shown in FIGS. 4 and 7.

Figure 8:
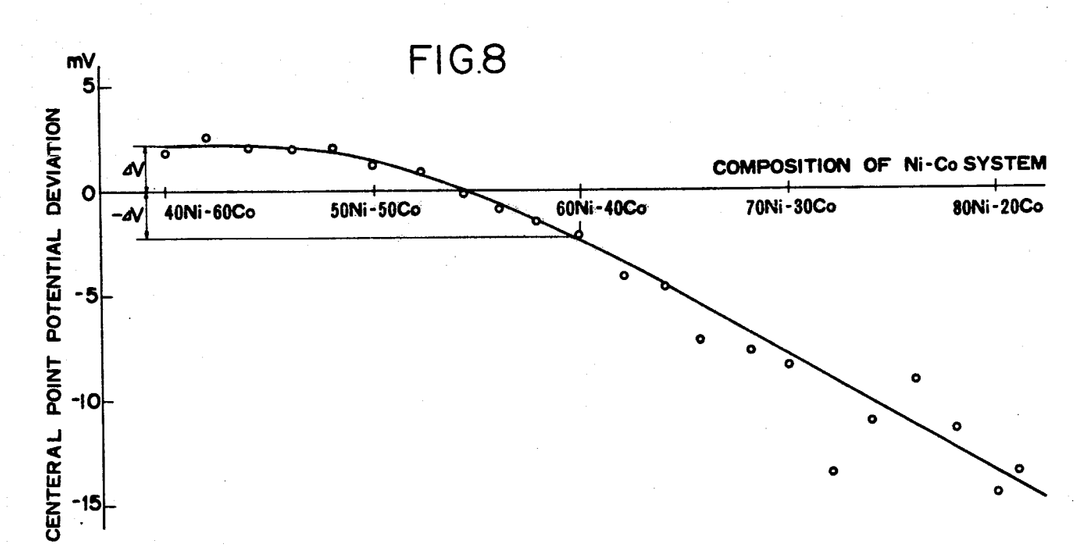
FIG. 8 is a graph showing the relationship between the composition of Ni-Co alloy system and the central point potential deviation.
Figure 9:
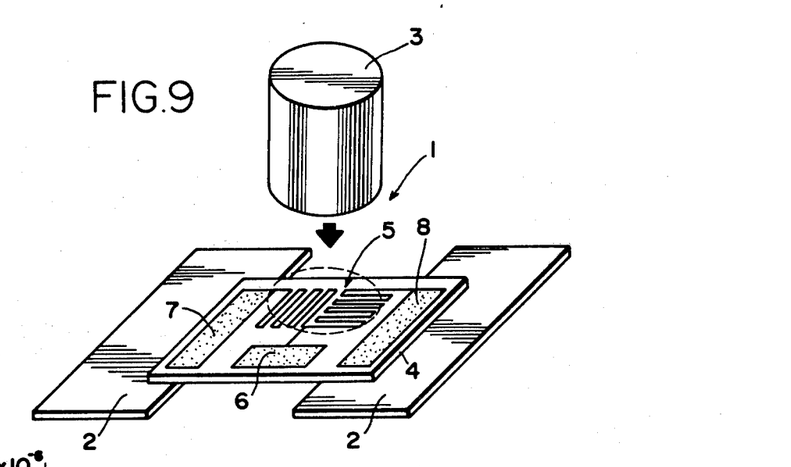
FIG. 9 is a schematic perspective view illustrating the measuring method of the central point potential deviation.

FIG. 8 is a graph showing a relationship between the compositions of Ni-Co alloys and the central point potential deviations of elements. The measurement on the central point potential deviation was made as illustrated in FIG. 9. A magnetoresistive element used therein comprises an insulating substrate, a first current conducting ferromagnetic metal film strip on the substrate and having a current carrying ability perdominantly in one direction, a second current carrying ferromagnetic metal film strip on the substrate having a current carrying ability predominantly in a drection substantially perpendicular to the one direction, first ends of the strips being connected together, a current input terminal connected to the opposite ends of the strips and an output terminal connected to the junction between the two strips. The sample element 1 having a dimension of $5 \times 3 \times 1$ mm$^3$ was mounted on a supporting plate 2 having a gap of 4 mm. A weight 3 of 1000 g having a weighing surface of 2.5 mm$\phi$ was placed on the element. The central point potential deviation of the element, that is, the output voltage at an output terminal 6 was measured by an external resistance bridge under the load by the weight 3. Compositions of the alloys were used by twenty-two kinds selected from the range of 40Ni–60Co to 81Ni–19Co. Alloys having the composition out of the above range were excepted from the measurement due to the abrupt decrease of its magnetoresistance anisotropy effect. Samples were the alloys for the vacuum evaporation which were made by the same manner as that described above with reference to FIG. 7 and plane glass plates of 1 mm thickness were used as the substrates 4 for the vacuum evaporation coating. The resistance heating method by the use of the electric resistance of tungsten (wolfrom) was used for the vacuum evaporation coating. In this case, the degree of vacuum was $1 \times 10^{-5}$ mmHg, the substrate temperature was 250° C., the average coating speed was 2500 A/min and the cooling speed was 1.5 to 2.0 deg/min. A pattern 5 of the magnetoresistance element comprised a pattern of three terminals of an output terminal 6 and current supply terminals 7 and 8. The pattern 5 had an electrode portion of large area. Photoresist as a mask for making the pattern was OFPR (a trademark name) and an etchant for making the pattern was a mixture of conc. HNO$_3$ and H$_2$O (conc. HNO$_3$:H$_2$O=1:4). A diamond cutter was used for cutting the substrate 4. The alloy film thickness was selectively about 2500 Å at which the thickness dependence of the magnetoresistance anisotropy could be disregarded.

FIG. 8 shows clearly that the strain effect (central point potential deviation) becomes zero at the composition of about 54Ni–46Co. It was also found out from another experimental result (not described here) that the zero point of the strain effect is independent of the substrate temperature. The central point potential deviation of the element having the alloy film containing Ni more than 54Ni–46Co is negative values and the absolute value thereof increases almost linearly with the increase of Ni content. On the other hand, the central point potential deviation of the element having the alloy film containing Ni less than 54Ni–46Co is positive value and the value thereof increases gradually with the decrease of Ni content and finally saturates at the composition of 40Ni–60Co. A negative value $-\Delta V$ of the deviation whose absolute value is equal to the saturated value $\Delta V$ of the deviation about the 40Ni–60Co alloy is obtained at the composition of 60Ni–40Co. From this, it is found out that the compositions of alloys containing Ni in the range of 40 to 60 atomic percent are indispensable to the alloy of this invention in order to keep the magnetoresistance anisotropy high and the central point potential deviation little within the desired range ($-\Delta V$ to $\Delta V$). It will be understood from FIG. 8 that the central point potential deviation of the alloy of 40Ni–60Co to 60Ni–40Co is remarkably less than that of the conventional alloy of 76Ni–24Co. The reason is supposed that since the alloy having the composition in the range of 40Ni–60Co to 60Ni–40Co according to this invention has a small magnetostriction constant, the strain resistance of the element is improved.

Figure 10:
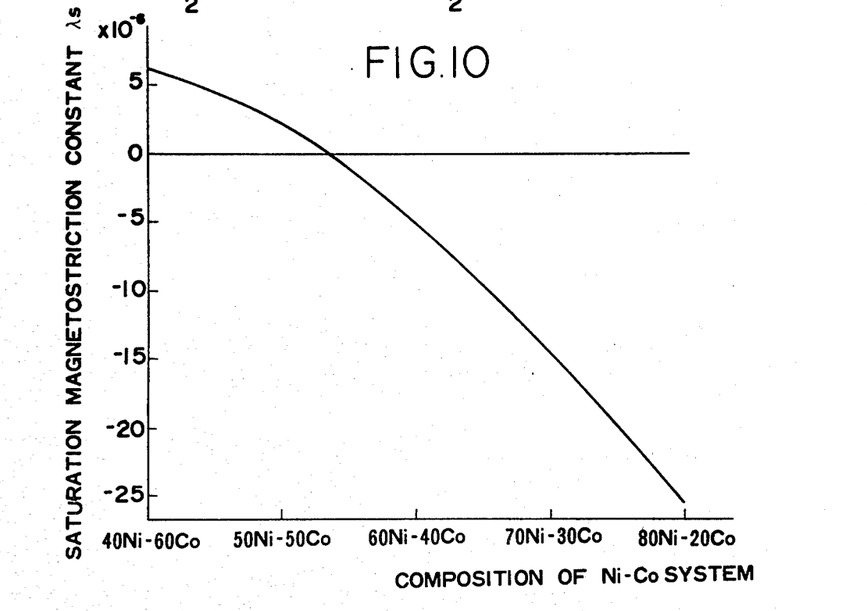
FIG. 10 is a graph showing the relationship between the composition of Ni-Co alloy system and the saturation magnetostriction constant.

FIG. 10 is a graph showing the composition dependence of the saturation magnetostriction constant reported by R. M. Bozorth, "Ferromagnetism", P.673 (1951), D. Van Nostrand Company Inc., New York). The graph of FIG. 10 is extremely similar to that of FIG. 8, therefore, it is found that there seems to be a close relationship between the strain effect and the saturation magnetostriction constant.

Magnetostriction means a phenomenon wherein the external form of a ferro-magnetic material is distorted to be deformed when the material is magnetized. When it is assumed that a length of the material in a demagnetized condition is lo and an elongation of the material magnetized to the saturation is $\Delta l$, the saturation magnetostriction is defined as $\lambda s = \Delta l/lo$ where $\lambda s$ is called a saturation magnetostriction constant. $\lambda s$ is a positive value, that is, $\lambda s > O$ when the elongation direction is in parallel with the magnetized direction, and a negative value, that is $\lambda s < O$ when the elongation direction is normal to the magnetized direction and the material shrinks in the magnetized direction. On the contrary, when a stress is applied to the material, the magnetized direction of each magnetic domain thereof is changed by the resulting strain. In the case that the material is elongated by a tensile stress, when $\lambda s$ is positive ($\lambda s > O$), the magnetization of each magnetic domain is changed in parallel with the stress, and when $\lambda s$ is negative ($\lambda s < O$), it is changed in the normal direction to the stress. These changes of the magnetized direction occur in each magnetic domain, and positive magnetization and negative magnetizations are equivalent with each other. Therefore, the magnetization does not always appear as a whole under a completely demagnetized condition. When a compression stress is applied to the material, "positive" and "negative" about the magnetization become reverse with each other in comparison with the above tensile stress. Even if the magnetization does not generate in the material by the stress, the magnetoresistance anisotropy effect dependent on the angle of the magnetized direction with the current direction is influenced by the change of the magnetized direction of each magnetic domain (also in this case, the positive and negative of the magnetization are equivalent with each other.). Therefore, when an external stress is applied to a material having the magnetostriction to strain the material, the magnetized direction of each magnetic domain is in general changed by the magnetostriction and so the electric resistance is changed with the magnetoresistance anisotropy effect in general. Accordingly, when a material having the small magnetostriction according to this invention is selected for a magnetoresistive element on the basis of the results of FIG. 8 and FIG. 10, the disadvantages due to the abovementioned effect can be clearly avoided in such element. In other words, when a magnetoresistive element is made of a material having the small magnetostriction according to this invention, a strain-resistant element which is not influenced by the strain of the substrate can be obtained.

Figure 11:
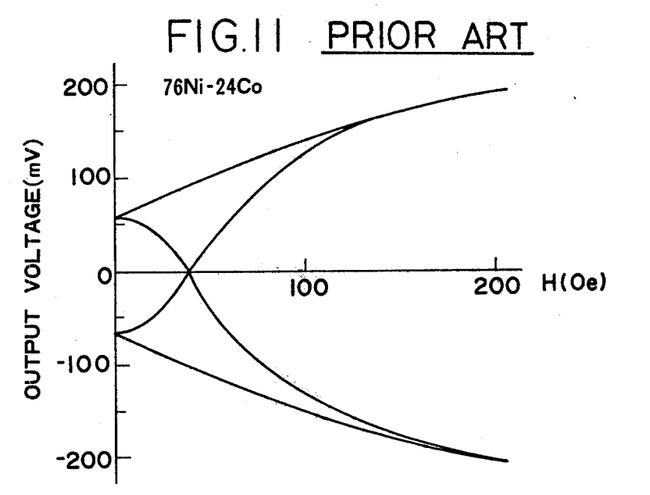
FIG. 11 is a graph showing the hysteresis curve of an Ni-Co alloy.
Figure 12:
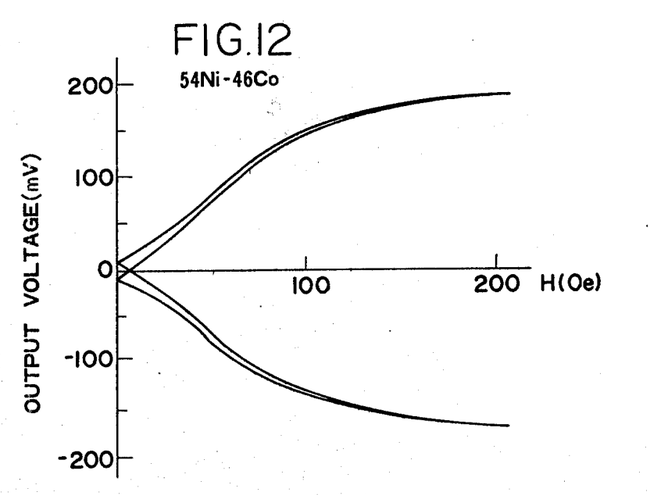
FIG. 12 is a graph showing the hysteresis curve of another Ni-Co alloy.

FIG. 11 and FIG. 12 show the saturation characteristics of the output voltage of magnetoresistive element. FIG. 11 shows a comparative example of the conventional 76Ni-24Co composition and FIG. 12 shows an embodiment of the 54Ni-46Co composition according to this invention. In these cases, the drive voltage is DC 10 V. In an evaporation-coated film, the deposited film material differs in general from the substrate material and therefore a strain generated in a slow cooling process due to the difference between the thermal expansion coefficients is absorbed by the deposited film. There is a case that the internal stress thereof causes the breaking stress of the film. The stronger the adherence between the substrate and the film surface, the less the absorbed stress into the boundary surface between them and the more the accumulated stress in the film. Accordingly, the accumulated stress in the film tends to increase as the difference between the thermal expansion coefficients of the substrate and the film becomes larger and as the adherence strength between them becomes larger. Thus resulting internal stress in the film causes the magnetostriction energy and influences the magnetic property of the film. On the other hand, the saturation magnetic field to determine the saturation property of a magnetoresistive element is defined as an external magnetic field which is required for making the magnetized direction of each magnetic domain uniform in the magnetic field direction. The saturation magnetic field is determined by a magnetic field which overcomes the demagnetizing field energy dependent upon the ratio of the width to the length of the stripe pattern of the element. However, if another condition of the vacuum evaporation coating or another kind of substrate is used, there is a much possibility that the saturation property of such element is deteriorated due to the magnetostriction energy.

As apparent from FIG. 11 and FIG. 12, the saturation magnetic field of the element of the conventional composition is in excess of 200 Oe which is considerably larger than that according to this invention. Because the condition of the vacuum evaporation coating and the kind of the substrate of the element in FIG. 11 are the same as these in FIG. 12, the above difference above the saturation magnetic field is clearly based upon the magnetostriction constant, and therefore it may be supposed that the magnetostriction energy, that is, the equivalent magnetic field influences the saturation property of the element. On the other hand, FIG. 11 anf FIG. 12 show that the hysteresis of the element of the conventional composition is extremely larger than that of the composition according to this invention. The hystenesis depends upon the energy and mobility of the magnetic domain walls. The energy of the magnetic domain walls is closely related also to the magnetostriction energy. The mobility of the magnetic domain walls is related also to the magnetostriction energy through the distribution of the internal stress. Accordingly, the hysteresis of the element of the composition having the small magnetostriction constant is naturally small. Besides, in the conventional magnetoresistive element, the saturation property is relatively bad and the hysteresises within lots and between the lots considerably differ from each other. This is supposed to be a natural result because manners of the accumulation of the magnetostriction energy, that is, internal stress in lots and between lots are not supposed to be identical with each other. Also from this, the composition having the small magnetostriction constant according to this invention is advantageous.

As described above, according to this invention, the alloy having an ordered phase with superstructure of the composition in the range of 40Ni-60Co to 60Ni-40Co which is deposited on the substrate at the substrate temperature of more than 250° C. results in the remarkably small magnetostriction constant of the element. Therefore, there can be provided the magnetoresistive element which has the good strain resistance and saturation property and the small variation of the property and which is by no means inferior to the conventional magnetoresistive element in the magnetoresistance anisotropy effect and the output voltage.

It will be evident that various modifications can be made to the described embodiments without departing from the scope of this invention.

What is claimed is:

1. An alloy for a magnetoresistive element having a small magnetostriction constant and a large magnetoresistance anisotropy ratio, said alloy having an ordered phase with superstructure and consisting of nickel and cobalt atoms, the atomic ratio of said nickel atoms to said cobalt atoms being substantially within the range of 40:60 to 60:40.

2. An alloy for a magnetoresistive element according to claim 1, in which the ratio of said nickel atoms to said cobalt atoms is 54:46.

3. An alloy for a magnetoresistive element according to claim 1, in which said superstructure is based on the CuAu I type.

4. An alloy for a magnetoresistive element accordng to claim 1 in which said superstructure is based on the CuAu II type.

5. A method of manufacturing an alloy for a magnetoresistive element comprising the steps of providing a substrate for a magnetoresistive element, and forming a nickel-cobalt alloy film on said substrate while said substrate is at a temperature of more than 250° C. such that said alloy has an ordered phase with superstructure and the ratio of said nickel atoms to said cobalt atoms is within the range of 40:60 to 60:40.

6. A method of manufacturing an alloy for a magnetoresistive element according to claim 5, in which the ratio of said nickel atoms to said cobalt atoms is 54:46.

7. A method of manufacturing an alloy for a magnetoresistive element according to claim 5, in which said superstructure is based on the CuAu I type.

8. A method of manufacturing an alloy for a magnetoresistive element according to claim 5, in which said superstructure is based on the CuAu II type.

9. A method of manufacturing an alloy for a magnetoresistive element according to claim 5, in which said nickel-cobalt alloy film is formed on said substrate by evaporation.

10. A method of manufacturing an alloy for a magnetoresistive element according to claim 9, in which the thickness of said nickel-cobalt alloy film is less than 10000 Å.

11. A method of manufacturing an alloy for a magnetoresistive element according to claim 10, in which the thickness of said nickel-cobalt alloy film is within the range of 1000 to 3000 Å.

12. A method of manufacturing an alloy for a magnetoresistive element according to claim 9, in which said nickel-cobalt alloy film is formed on said substrate by evaporation at the temperature of 250° to 500° C.

13. A method of manufacturing an alloy for a magnetoresistive element according to claim 12, in which said nickel-cobalt alloy film is formed on said substrate by evaporation at the temperature of 300° to 500° C.

14. A method of manufacturing an alloy for a magnetoresistive element according to claim 9, in which said nickel-cobalt alloy film is formed on said substrate by evaporation at the speed of 20 to 100 Å/sec.

15. A method of manufacturing an alloy for a magnetoresistive element according to claim 14, in which said nickel-cobalt alloy film is formed on said substrate by evaporation at the speed of 40 to 80 Å/sec.

* * * * *